(12) United States Patent
Yamamoto

(10) Patent No.: US 10,076,027 B2
(45) Date of Patent: Sep. 11, 2018

(54) SUBSTRATE FOR CONNECTION AND DISPLAY APPARATUS

(71) Applicant: NLT TECHNOLOGIES, LTD., Kawasaki, Kanagawa (JP)

(72) Inventor: Atsushi Yamamoto, Kanagawa (JP)

(73) Assignee: NLT TECHNOLOGIES, LTD., Kawasaki, Kanagawa (JP)

( * ) Notice: Subject to any disclaimer, the term of this patent is extended or adjusted under 35 U.S.C. 154(b) by 85 days.

(21) Appl. No.: 15/134,476

(22) Filed: Apr. 21, 2016

(65) Prior Publication Data

US 2016/0316577 A1 Oct. 27, 2016

(30) Foreign Application Priority Data

Apr. 22, 2015 (JP) ................. 2015-087621

(51) Int. Cl.
| | |
|---|---|
| *H05K 1/11* | (2006.01) |
| *H05K 1/14* | (2006.01) |
| *H05K 1/02* | (2006.01) |
| *G09G 5/00* | (2006.01) |

(52) U.S. Cl.
CPC ........... *H05K 1/0296* (2013.01); *G09G 5/006* (2013.01); *H05K 1/028* (2013.01); *G09G 2300/0421* (2013.01); *H05K 1/0283* (2013.01); *H05K 1/147* (2013.01); *H05K 2201/09036* (2013.01); *H05K 2201/09272* (2013.01); *H05K 2201/10136* (2013.01)

(58) Field of Classification Search
CPC ........... G09G 2300/0421; G09G 5/006; H05K 1/028; H05K 1/0283; H05K 1/0296; H05K 1/147; H05K 2201/09036; H05K 2201/09272; H05K 2201/10136
See application file for complete search history.

(56) References Cited

U.S. PATENT DOCUMENTS

| | | | |
|---|---|---|---|
| 8,130,514 B2 * | 3/2012 | Onodera | G02F 1/1345 174/260 |
| 9,148,957 B2 * | 9/2015 | Matsui | H01L 24/16 |
| 9,370,116 B2 * | 6/2016 | Jo | H05K 7/02 |
| 2014/0247252 A1 * | 9/2014 | Lee | G09G 3/20 345/204 |
| 2015/0077950 A1 * | 3/2015 | Tashiro | H05K 1/0281 361/749 |

FOREIGN PATENT DOCUMENTS

| | | |
|---|---|---|
| JP | 63-313187 A | 12/1988 |
| JP | S63313187 | * 12/1988 |
| JP | 2001-109391 A | 4/2001 |

* cited by examiner

*Primary Examiner* — Yuriy Semenenko
(74) *Attorney, Agent, or Firm* — Sughrue Mion, PLLC

(57) ABSTRACT

A common substrate for connection 10 capable for display apparatuses having different sizes or numbers of pixels is provided. In some cases, a common signal processing board 40 also provided. There is provided a substrate for connection 10 electrically connecting a display panel 30 and a signal processing board 40 which includes a circuit to control the display panel 30. The display panel 30 is provided with a driver circuit 32 to drive the display panel 30, the substrate for connection 10 is integrally formed, and the substrate for connection 10 comprises a variable part 16 configured to change a distance between connection terminal blocks 11 in a connection terminal pitch direction, between the connection terminal blocks 11 in which no connection terminal is disposed.

9 Claims, 18 Drawing Sheets

F I G. 8
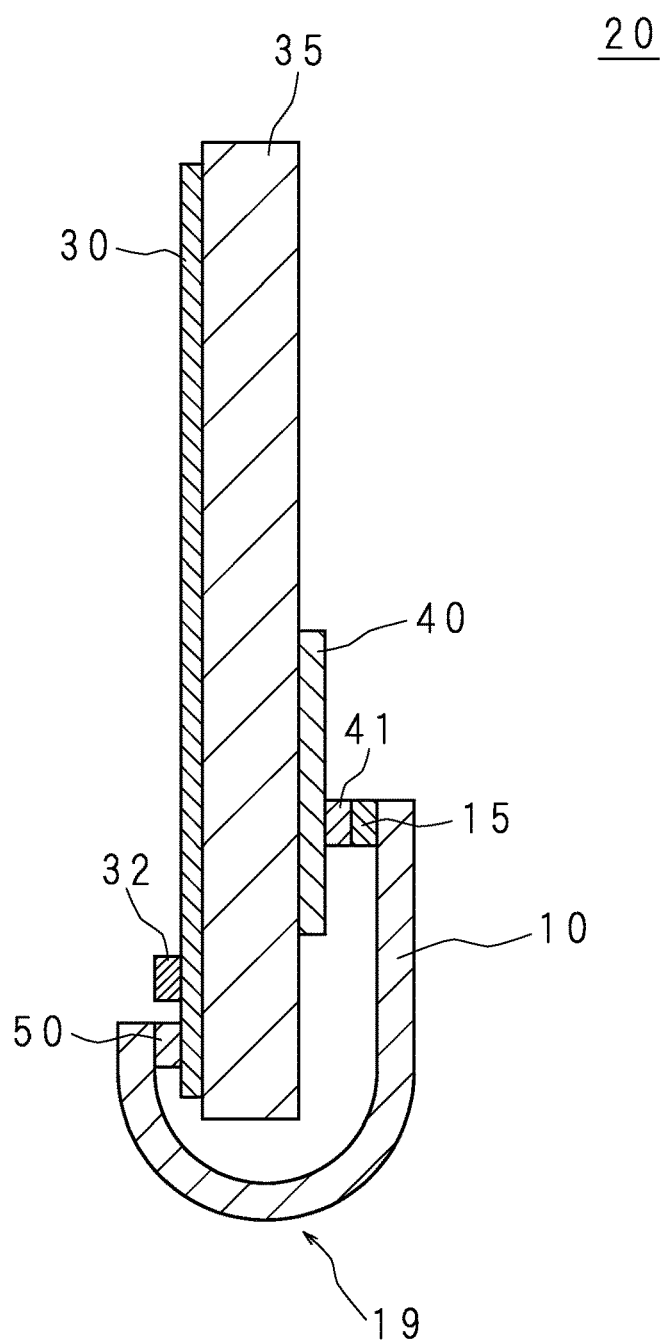

SUBSTRATE FOR CONNECTION AND DISPLAY APPARATUS

CROSS-REFERENCE TO RELATED APPLICATIONS

This non-provisional application claims priority under 35 U.S.C. § 119(a) on Patent Application No. 2015-087621 filed in Japan on Apr. 22, 2015, the entire contents of which are hereby incorporated by reference.

BACKGROUND

1. Field of the Invention

The present invention relates to a substrate for connection and a display apparatus.

2. Description of the Related Art

For example, in a liquid crystal display apparatus, a liquid crystal display, in which a liquid crystal display panel including a plurality of display pixels disposed in a matrix shape and a driver circuit mounted or embedded therein to control and drive the display pixels, and a signal processing board which generates a gradation voltage signal and a driver control signal are connected by a substrate for connection made of flexible printed circuits (FPCs), has been developed.

In the liquid crystal display, a display panel having a variety of sizes and numbers of pixels is present. Distances between connection terminal blocks provided in the substrate for connection are required to be changed for each of the sizes or the numbers of pixels of the liquid crystal display panel. As a result, it is necessary for the substrate for connection to be designed and prepared for each of the sizes or the numbers of pixels of the liquid crystal display panel, and therefore the number of design processes, development costs such as die production cost for outer shape punching-out are increased.

Whereas, there is a case capable of sharing some substrates for connection by adequately routing a wiring between the terminals which connect the display pixels on the liquid crystal display panel and integrated circuits (ICs) of the driver circuit, that is, by adjusting positions of the connection terminals at the liquid crystal display panel side. However, increasing the number of output terminals of the driver IC, and narrowing a frame of the liquid crystal display panel have been progressed, leading to a routing space of the wiring between the display pixel and the connection terminal being narrowed, so that there is a limitation on the adequate routing options.

In Japanese Patent Application Laid-Open No. 2001-109391 (hereinafter, referred to as Patent Document 1), a substrate for connection, in which a position of an electrode group on the display panel side and a position of an electrode group on the signal processing board are offset from each other, has been proposed. The substrate for connection of Patent Document 1 may be used for a plurality of specifications of display panels by changing an arrangement of the substrate for connection depending on the size of the display panel.

In Japanese Patent Application Laid-Open No. S63-313187 (hereinafter, referred to as Patent Document 2), a long chip on flexible (COF) substrate, in which a plurality of blocks of FPC on which an IC of a driver circuit is mounted are connected with each other through connection parts, has been proposed. In the COF substrate of Patent Document 2, the required number of blocks are cut depending on the number of the pixels of the liquid crystal display panel, and the blocks are connected with each other by bending the connection parts to accommodate the size of the liquid crystal display panel.

SUMMARY

When the substrate for connection of Patent Document 1 is used in display panels having different specifications, the arrangement of the terminals on the signal processing board is changed due to the arrangement of the substrate for connection. Therefore, it is not possible to share the signal processing board between the display panels of different specifications.

In the COF substrate of Patent Document 2, when using the cut block by three ICs, if one IC among the three ICs is faulty, there is a need to discard the entirety of the cut portion. Since the IC of the driver circuit is an expensive component, it is not preferable to discard functioning components. In addition, Patent Document 2 does not describe the signal processing circuit.

It is an object of the present invention to provide a common substrate for connection for display apparatuses having different sizes or numbers of pixels.

According to the present invention, there is provided a substrate for connection electrically connecting a display panel and a signal processing board which includes a circuit to control the display panel. The display panel is provided with a driver circuit to drive the display panel, the substrate for connection is integrally formed, and the substrate for connection comprises a variable part configured to change a distance between connection terminal blocks in a connection terminal pitch direction, between the connection terminal blocks in which no connection terminal is disposed.

It is possible to share a substrate for connection among display apparatuses having different sizes or numbers of pixels. In some cases, it is possible to share a signal processing board.

BRIEF DESCRIPTION OF THE DRAWINGS

FIG. 8 is an explanatory view illustrating an arrangement of a signal processing board.

DETAILED DESCRIPTION

Embodiment 1

In a substrate for connection and a display apparatus using the substrate for connection according to the present invention, a case in which the substrate for connection is used in a connection of a liquid crystal display panel on which driver ICs for driving display pixels are provided and a signal processing board for controlling the driver ICs, will be described as an example. Further, the liquid crystal display panel is an example of the display panel of the present invention.

Figure 1A:
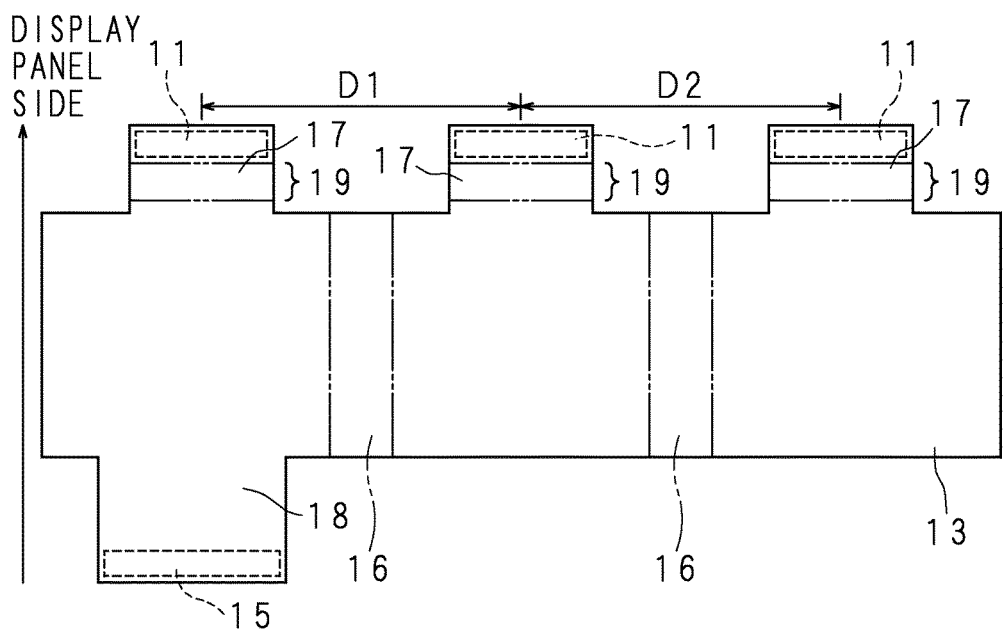
FIG. 1A and FIG. 1B illustrate explanatory views of a substrate for connection.
Figure 1B:
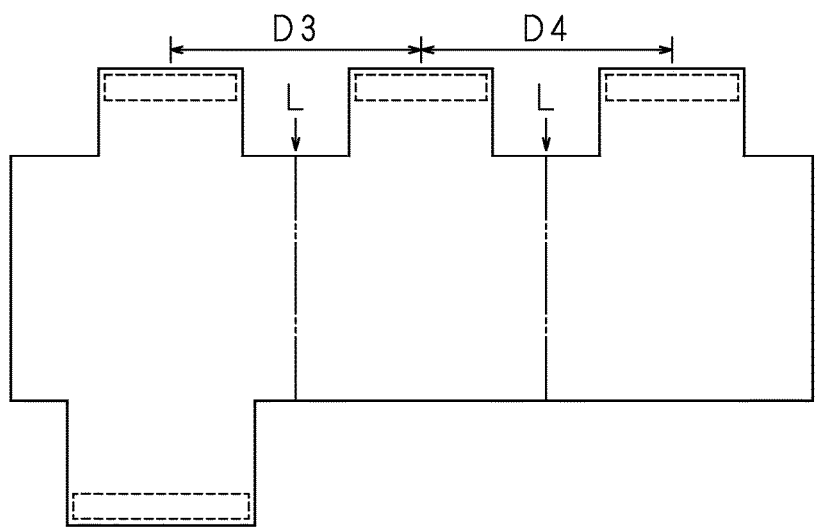

First, an outline of the substrate for connection will be described. FIG. 1A and FIG. 1B illustrate explanatory views of a substrate for connection 10. As illustrated in FIG. 1A, variable parts 16 capable of changing distances between connection terminal blocks 11 are provided between the connection terminal blocks 11 on the display panel side. By folding the variable parts 16, distances D1 and D2 between the connection terminal blocks 11 may be changed to distances D3 and D4. Thereby, when the display panels have different sizes or numbers of pixels, it is possible to use the same FPC.

In the following description, D3 and D4 are referred to as a first distance, and D1 and D2 are referred to as a second distance. The first distance is shorter than the second distance.

Figure 2A:
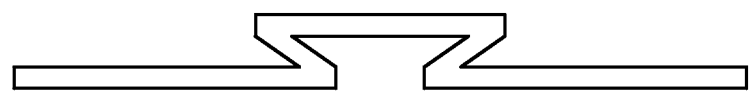
FIG. 2A to FIG. 2C illustrate views illustrating a variable part of the substrate for connection as viewed from an arrow L direction in FIG. 1A and FIG. 1B.
Figure 2B:
Figure 2C:

FIG. 2A to FIG. 2C illustrate the variable part 16 of the substrate for connection 10 as viewed from an arrow L direction in FIG. 1A and FIG. 1B. As illustrated in FIG. 2A to FIG. 2C, by folding or slackening the variable parts 16, the distances between the connection terminal blocks 11 may be changed.

A configuration of the substrate for connection 10 will be described in detail with reference to FIG. 1A and FIG. 1B. FIG. 1A is a plan view of the substrate for connection 10. The substrate for connection 10 has a shape in which rectangular extension parts 17 are provided at three places of one long side of a rectangular body part 13, and a rectangular connection part 18 is provided at one place of the other long side thereof. Each of the extension parts 17 and the connection part 18 are consecutively formed with the body part 13 at one long side thereof. The body part 13 includes rectangular variable parts for connecting the long side at which the extension parts 17 are consecutively formed and the long side at which the connection part 18 is consecutively formed. The variable parts 16 will be described below. The extension parts 17 include rectangular inversion parts 19 along the long side connected with the body part 13. The inversion parts 19 will be described below. The substrate for connection 10 is a substrate in which the body part 13, the extension parts 17 and the connection part 18 are integrally formed in a seamless way.

The connection terminal blocks 11 are provided on a rear surface of the drawing sheet of FIG. 1A and FIG. 1B along long sides of the extension parts 17 which is not connected with the body part 13. A group of first electrode terminals 12 (see FIG. 6) is formed in the connection terminal blocks 11.

A connector 15 is provided on the rear surface of the drawing sheet of FIG. 1A and FIG. 1B along a long side of the connection part 18 which is not connected with the body part 13. The connector 15 is an inter-board connector which connects electric circuits provided in two circuit boards. A group of second electrode terminals (not illustrated) is formed in a connection part between the substrate for connection 10 and the connector 15. The group of the first electrode terminals 12 and the group of the second electrode terminals are electrically connected by a plurality of wiring patterns (not illustrated). Further, in the following description, the group of the first electrode terminals 12 and the group of the second electrode terminals are referred to as a first electrode terminal group and a second electrode terminal group, respectively.

FIG. 1B illustrates a state in which the distances between the connection terminal blocks 11 are changed by deforming the variable parts 16 of the substrate for connection 10.

A usage of the variable parts 16 will be described with reference to FIG. 2A to FIG. 2C. FIG. 2A illustrates a state in which the substrate for connection 10 is folded at two places of an edge of the variable part 16 and two inner places of the variable part 16 in a direction parallel to a short side of the body part 13. FIG. 2B illustrates a state in which the substrate for connection 10 is folded at one place of the edge of the variable part 16 and one inner place of the variable part 16 in the direction parallel to the short side of the body part 13. FIG. 2C illustrates a state in which the substrate for connection 10 is slackened at the variable part 16 in the direction parallel to the short side of the body part 13.

By folding or slackening the variable parts 16, the distances between the connection terminal blocks 11 are changed from D1 and D2 which correspond to the second distance to D3 and D4 which correspond to the first distance. The first distance may be appropriately adjusted by a position of folding or an amount of slackening. Thereby, when the display panels have sizes or numbers of pixels that are different from each other, it is possible to use the same substrates for connection 10.

A usage example in which the substrates for connection 10 having the same configuration are applied to two types of display panels having the same number of pixels but different sizes is described.

Figure 3:
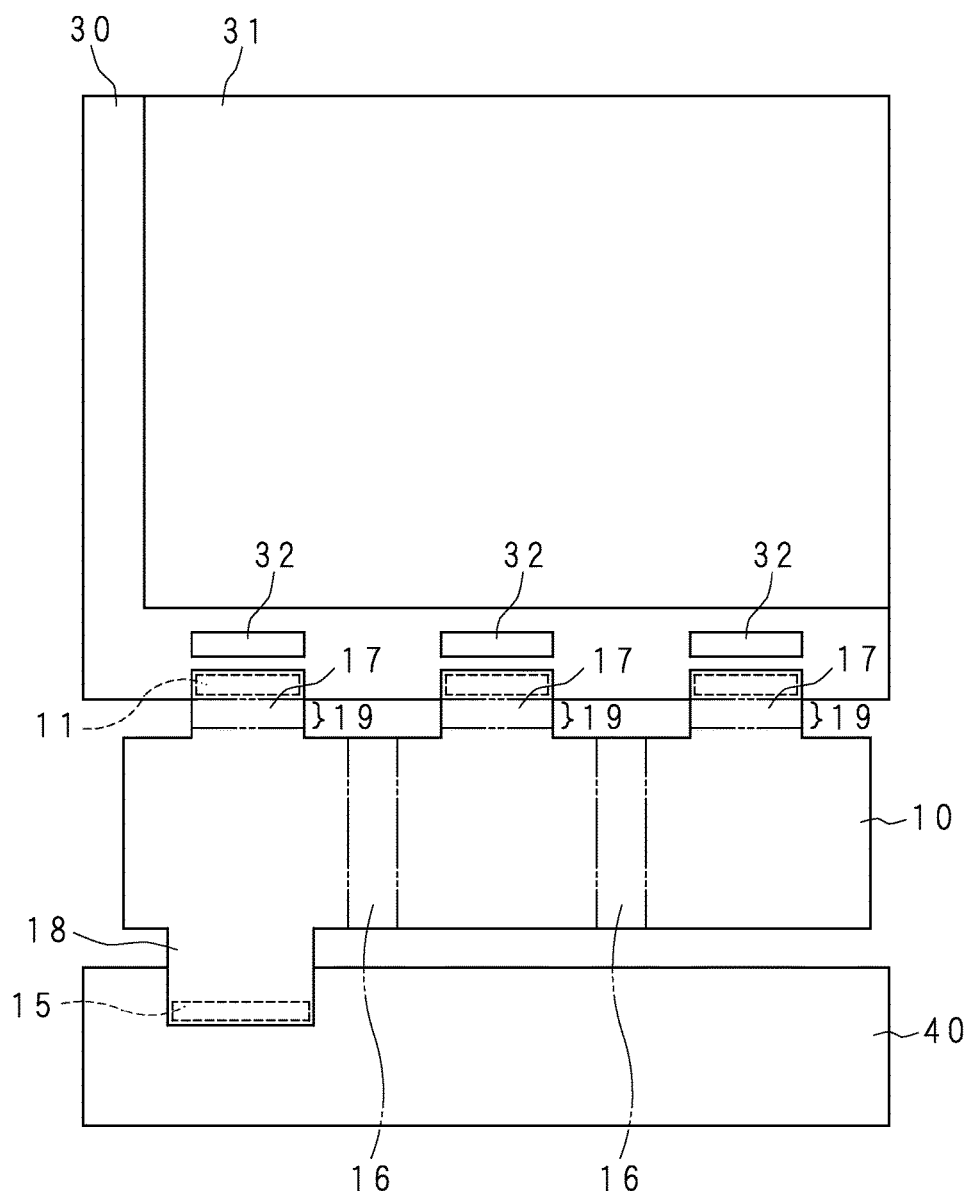
FIG. 3 is an explanatory view illustrating a usage example of the substrate for connection.
Figure 4:
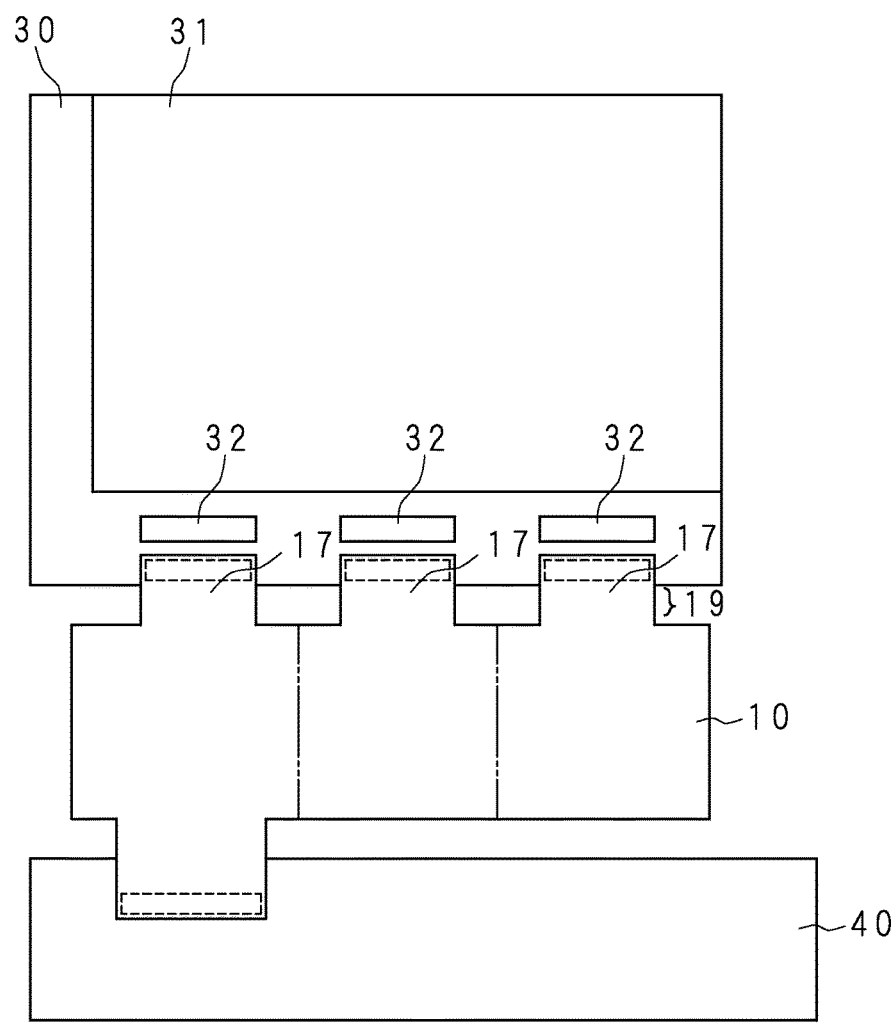
FIG. 4 is an explanatory view illustrating a usage example of the substrate for connection.

FIGS. 3 and 4 are views illustrating the usage example of the substrate for connection 10. The substrate for connection 10 is used in the connection between a display panel 30 and a signal processing board 40.

As illustrated in FIG. 3, the substrate for connection 10 is disposed between the display panel 30 and the signal processing board 40. The display panel 30 and the substrate for connection 10, and the signal processing board 40 and the substrate for connection 10 are electrically connected through a connection member 50 made of an anisotropic conductive film (ACF) and the connector 15, respectively. The ACF is an anisotropic conductive film which is conductive in its thickness direction while not being conductive in its in-plane direction.

In addition, on the display panel 30, ICs of the driver circuits 32 are electrically connected thereto through ACF. The display pixels, the driver circuits 32 and the connection terminal blocks 11 are electrically connected through a plurality of wiring patterns (not illustrated) formed on the display panel 30. Further, the driver circuits 32 may be embedded in the display panel 30 so long as they have the same function as that of the ICs.

As described above, the substrate for connection 10 has the variable parts 16. When the number of terminals is the same and only the distances between the connection terminal blocks 11 are different from each other, the substrate for connection may be used in the display panel 30, for example, as illustrated in FIG. 4, which has a different size from that of FIG. 3, by folding the variable parts 16 to change the distances between the connection terminal blocks 11.

The usage example of the substrate for connection 10 will be described in more detail. FIG. 3 is an explanatory view illustrating the usage example of the substrate for connection 10 according to the present embodiment. The display panel 30 illustrated in FIG. 3 is, for example, a liquid crystal display panel of a 10.4 inch and a super video graphics array (SVGA) size. The SVGA size means the number of pixels of 800 horizontal pixels by 600 vertical pixels. The display panel 30 includes the driver circuits 32, a display unit 31 and a terminal part (not illustrated). The display unit 31 has 480,000 (=800×600) display pixels disposed therein.

Each of the driver circuits 32 is a circuit for driving each display pixel. In the present embodiment, the driver circuits 32 are disposed on the display panel 30 by being divided into three portions. In the present embodiment, each of the divided portions uses the ICs. In the following description, each of the ICs used will also be described as the driver circuit 32.

The signal processing board 40 is a substrate on which the signal processing board which generates a signal for controlling the driver circuits 32 such as a gradation voltage signal, or a driver control signal is mounted.

In the usage example of FIG. 3, the display panel 30 and the signal processing board 40 are connected by the substrate for connection 10 in a flat state illustrated in FIG. 1A. As illustrated in FIG. 1A, the distances between the connection terminal blocks 11 are D1 and D2, that is, the second distance.

The display panel 30 illustrated in FIG. 4 has the same number of pixels as that of the display panel 30 illustrated in FIG. 3 but the display unit 31 is smaller than the same. For example, the display panel 30 illustrated in FIG. 4 is a liquid crystal display panel of an 8.4 inch and an SVGA size. The signal processing board 40 illustrated in FIG. 4 is the same as the signal processing board 40 illustrated in FIG. 3.

In the usage example of FIG. 4, the display panel 30 and the signal processing board 40 are connected by the substrate for connection 10 which is folded at the variable parts 16 of two places. The connection terminal blocks 11 are so positioned that the distance between adjacent connection terminal blocks 11 is shortened to the first distance by the folded variable parts 16. That is, the first electrode terminals forming the connection terminal blocks 11 are also positioned by the variable parts 16. As illustrated in FIG. 1B, the distance between the connection terminal blocks 11 corresponds to D3 and D4, that is, the first distance.

Figure 5:
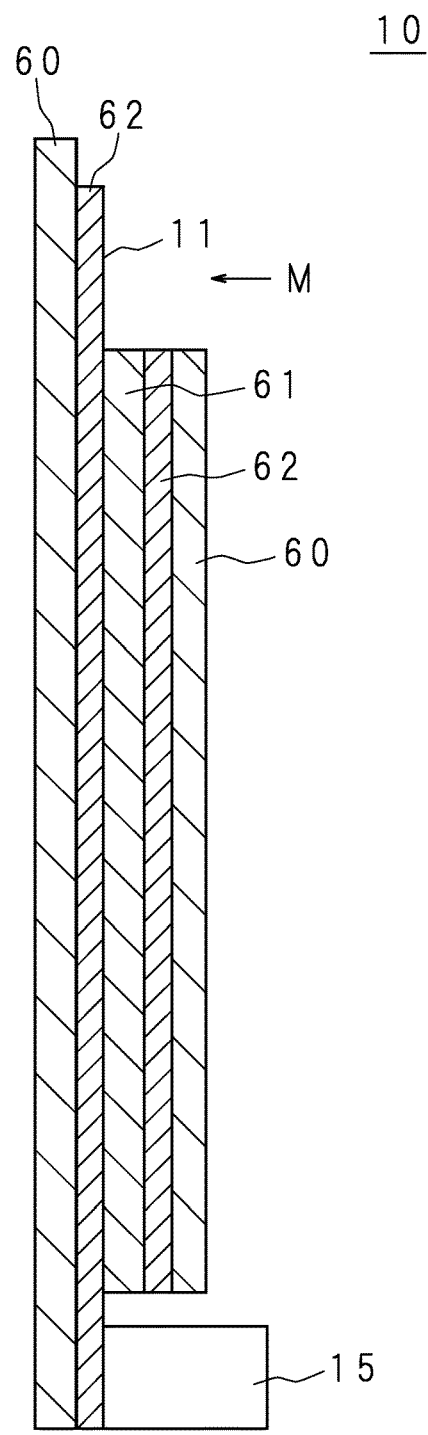
FIG. 5 is a section view of the substrate for connection.
Figure 6:
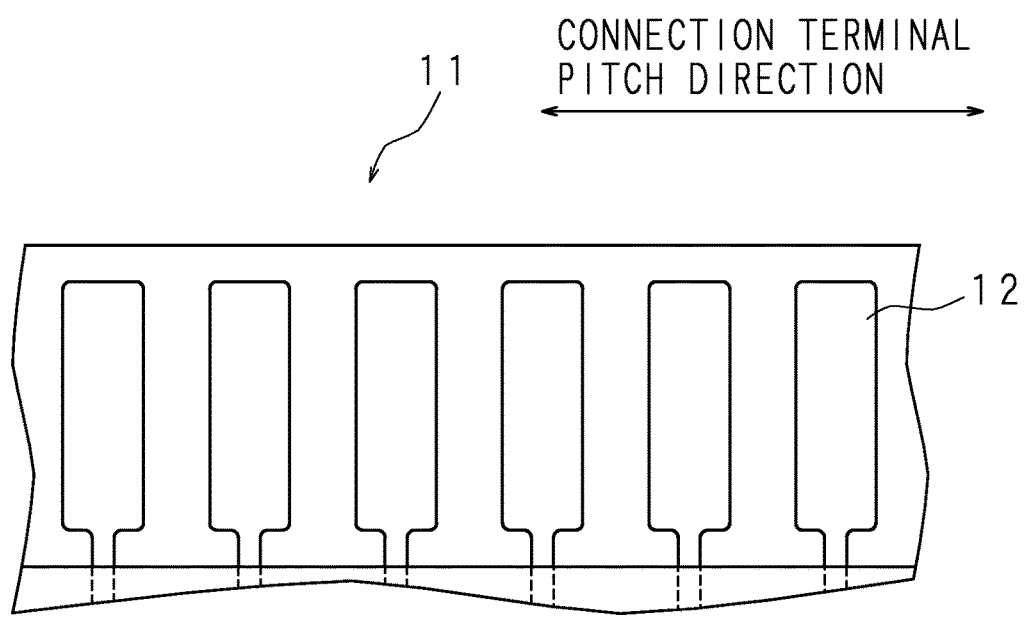
FIG. 6 is a view illustrating the substrate for connection as viewed from an arrow M direction in FIG. 5.

FIG. 5 is a section view of the substrate for connection 10. FIG. 6 is a view illustrating the substrate for connection 10 as viewed from an arrow M direction in FIG. 5. The structure of the substrate for connection 10 according to the present embodiment will be described with reference to FIGS. 5 and 6.

As illustrated in FIG. 5, the substrate for connection 10 is the FPC having a five-layer structure in which a surface layer 60, a conductor layer 62, a resin layer 61, another conductor layer 62, and another surface layer 60 are laminated in this order. The surface layer 60 and the resin layer 61 are made of a polyimide film, for example. The conductor layer 62 is a copper foil, for example. The conductor layer 62 has the wiring patterns formed by etching, for example. Vias (not illustrated) are provided between the wiring patterns formed on two conductor layers 62 for electrically connecting them.

The connection terminal block 11 includes a plurality of first electrode terminals 12. The first electrode terminal 12 is a portion in which the conductor layer 62 is formed in rounded corner rectangular pattern. First electrode terminals 12 are arranged in a row at a prescribed pitch along the long side of each extension part 17. First electrode terminals 12 are disposed over the substantially entire length of the extension part 17. Each of the first electrode terminal 12 is electrically connected with the terminal of the connector 15 through the wiring pattern provided on the conductor layer 62. In the following description, a direction in which the first electrode terminals 12 are arranged is described as a connection terminal pitch direction.

The connection part 18 includes a second electrode terminal group (not illustrated). The second electrode terminal group is a plurality of electrode terminals corresponding to the terminals of the connector 15. The connector 15 is mounted on the substrate for connection 10 through the second electrode terminals.

Figure 7:
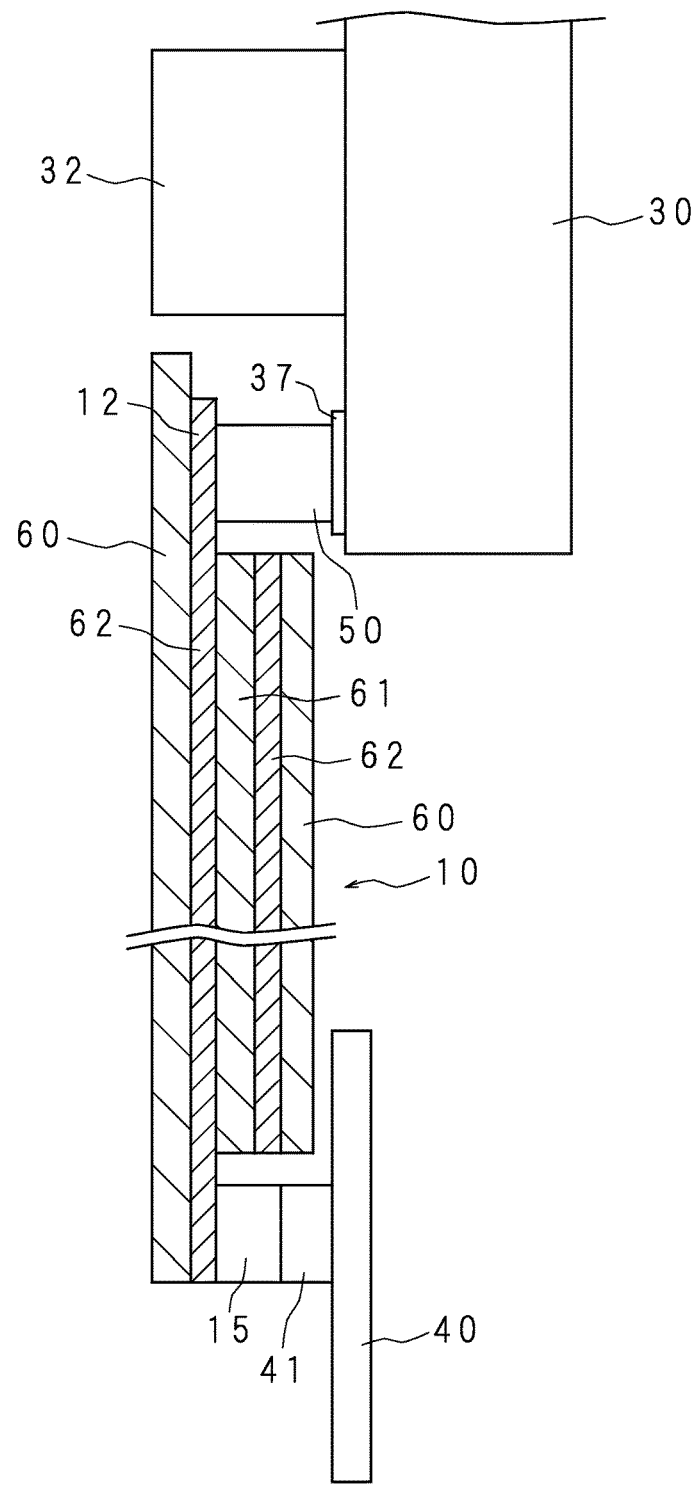
FIG. 7 is an explanatory view illustrating a method of connecting the substrate for connection.

FIG. 7 is an explanatory view illustrating a method of connecting the substrate for connection 10. A structure of a connection portion between the signal processing board 40 and the substrate for connection 10 will be described with reference to FIG. 7.

The signal processing board 40 includes a connector 41. The connector 41 is a connector corresponding to the connector 15 provided on the substrate for connection 10. By the connector 41 and the connector 15, the signal processing board 40 and the substrate for connection 10 are connected.

The electrode provided in the signal processing board 40 and the second electrode provided in the substrate for connection 10 may be connected using a conductive material such as an ACF, a bonding wire, or a soldering. In this case, the connector 15 and the connector 41 are not used.

The display panel 30 includes the terminal part in the vicinity of the driver circuits 32. The terminal part has third electrode terminals 37 disposed therein at the same pitch and in the same number as the first electrode terminals 12 of the connection terminal block 11. The third electrode terminals 37 are electrically connected with the terminals of the driver circuits 32 by wiring members (not illustrated) provided on the display panel 30. The third electrode terminals 37 are connected with the first electrode terminals 12 through the connection member 50 in one-to-one correspondence.

An outline of a procedure for connecting the substrate for connection 10 and the display panel 30 will be described. The display panel 30 and the substrate for connection 10 are positioned so that the first electrode terminals 12 and the third electrode terminals 37 face each other. The ACF is sandwiched between the terminal part of the display panel 30 and the connection terminal block 11 to form a laminated portion. The laminated portion is sandwiched by a head of a pulse heater, for example, and is heated while being pressed. After heating for a few seconds, the laminated portion is cooled to a room temperature. Then, the display panel 30 and the connection terminal block 11 are removed from the head of the pulse heater. Accordingly, the substrate for connection 10 and the display panel 30 are bonded while the terminals facing each other with the ACF interposed in between are conducted. Here, the adjacent terminals of the connection terminal block 11 are, however, not conducted. By the above-described processes, the display panel 30 and the substrate for connection 10 are connected.

The head of the pulse heater uses a head having a dimension and shape in accordance with the dimension and shape of a portion to be connected. By using the head having the dimension covering the plurality of connection terminal blocks 11, the plurality of connection terminal blocks 11 are simultaneously connected, and thereby assembly time may be shortened.

If the head having a dimension covering one connection terminal block 11 is adequately used for individual connection of each connection terminal block 11, it is possible to reduce a problem such as a shift of a connection position due to the influence of a repulsive force of the folded place.

FIG. 8 is an explanatory view illustrating an arrangement of the signal processing board 40. FIG. 8 illustrates a section view in which a display apparatus 20 using the display panel 30 is cut by a surface including the connector 15 in a direction parallel to the short side direction of the display panel 30. FIG. 8 illustrates a display surface of the display apparatus 20 for displaying an image on the left side.

A surface of the display panel 30 opposite to the display surface is covered with a backlight unit 35. The backlight unit 35 is a lighting device which has a rectangular plate shape slightly larger than the display panel 30 and which uniformly irradiates the display unit 31 from the rear side. The inversion part 19 is a portion which is bent in a J shape at the edges of the display panel 30 and the backlight unit 35 to invert the substrate for connection 10. The signal processing board 40 connected to the substrate for connection 10 is disposed on a side opposite to the display panel 30 with the backlight unit 35 sandwiched therebetween.

Figure 9:
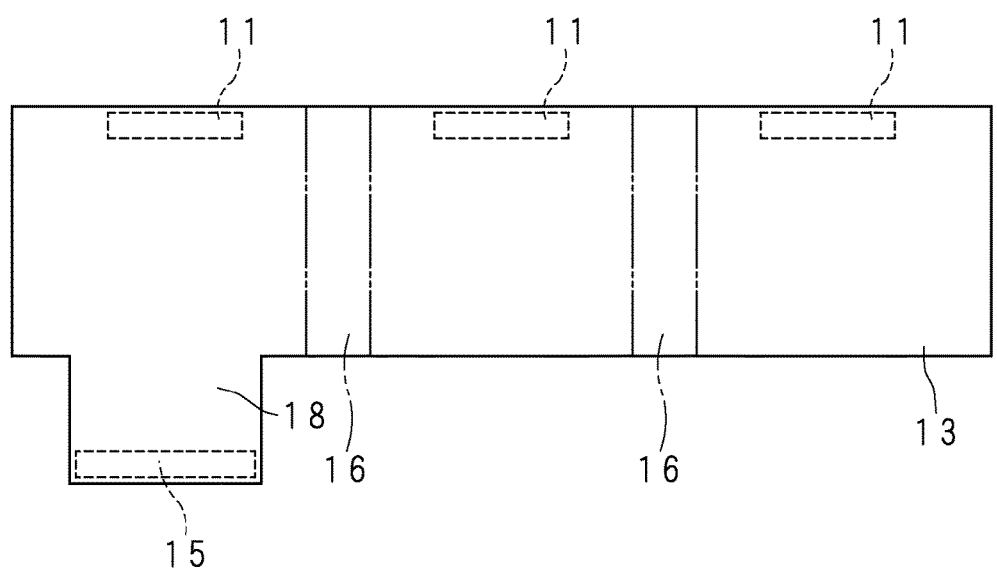
FIG. 9 is an explanatory view illustrating a comparative example of another method of using the substrate for connection.

FIG. 9 is an explanatory view illustrating a comparative example of another method of using the substrate for connection 10. An operation of the extension parts 17 provided in the substrate for connection 10 will be described with reference to FIG. 9.

In the liquid crystal display, as illustrated in FIG. 8, the signal processing board 40 is often disposed on the rear side of the backlight unit 35. In this case, it is necessary for the substrate for connection 10 to be bent in a direction as illustrated in FIG. 8. At this time, if the variable parts 16 are folded, the substrate for connection 10 is doubled, making difficult to bend the folded portion in the direction as illustrated in FIG. 8.

This will be described in more detail with reference to FIG. 9. FIG. 9 is a plan view illustrating the shape of the substrate for connection 10 of a comparative example. As illustrated in FIG. 9, the variable parts 16 are disposed in the substrate for connection 10 so that the upper sides thereof are aligned between the connection terminal block 11 and the adjacent connection terminal block 11, to be formed in a rectangular shape. If the variable parts 16 are bent, as illustrated in FIG. 8, it is difficult to fold the substrate foe connection 10 toward the rear side of the backlight unit 35.

Compared with this, the substrate for connection 10 illustrated in FIG. 1A and FIG. 1B may avoid interference with the variable parts 16 by protruding the connection terminal block 11 in a direction perpendicular to a folding direction from the upper side portion of the body part 13, and further providing the extension parts 17 which extends the portion of the connection terminal block 11 in a width of the connection terminal block 11 by only a required amount. The required amount mentioned here is, for example, a length of a thickness or more of the backlight unit 35 which is disposed on a back surface of the liquid crystal display panel or the like. In order to achieve the above configuration, the variable part 16 is not disposed on the extension of the connection terminal block 11.

According to the present embodiment, for display apparatuses having different sizes or numbers of pixels, it is possible to facilitate the sharing of the substrate for connection 10, and reduce the number of design processes, development costs such as die production cost for outer shape punching-out. In addition, it is also possible to share the signal processing board 40.

The specifications for two types of the display panels 30 illustrated in the present embodiment are mere examples, and it is possible to employ a display panel 30 having any screen size, number of pixels, and shape.

The liquid crystal display panel illustrated in the present embodiment is mere an example of the display panel 30, and it is possible to also apply the present technique to a display apparatus using an organic electro-luminescence (EL) display, an electronic paper or the like as the display panel.

An anisotropic conductive adhesive may be used in the connection member 50. In this case, after applying a paste-shaped anisotropic conductive adhesive to the connection terminal block 11 or the terminal part of the display panel 30 to a prescribed thickness, the terminal part of the display panel 30 and the connection terminal block 11 are overlapped and heated while being pressed, thereby bonding the same. The function of the anisotropic conductive adhesive after bonding is similar to that of the anisotropic conductive film.

A solder may be used in the connection member 50. In this case, for example, by a so-called solder leveler process in which the connection terminal block 11 is immersed in a molten solder and taken out, a solder layer is formed on the surface of the first electrode terminal 12. Then, the terminal part of the display panel 30 and the connection terminal block 11 are overlapped and heated while being pressed, thereby again melting the solder and bonding the same. The function of the soldered portion after bonding is similar to that of the anisotropic conductive film.

The conductor layer 62 of the substrate for connection 10 is not limited to two layers. The conductor layer 62 may be provided in only one layer, or may be provided in three layers or more. Further, the resin layer 61 is disposed between the respective conductor layers 62. The substrate for connection 10 may have the conductor layer 62 as an outermost layer. Also, the substrate for connection 10 may have the conductor layer 62 as one outermost layer, and the resin layer 61 as the other outermost layer.

The conductor layer 62 of the substrate for connection 10 may be formed by printing a paste of conductive material such as silver or carbon on the surface of the resin layer 61 in a prescribed pattern.

The shape of the substrate for connection 10 is not limited to the substrate illustrated in FIG. 1A and FIG. 1B. The substrate for connection may be formed in any shape for connecting the display panel 30 and the signal processing board 40 with each other.

The substrate for connection 10 may use a so-called rigid-flex substrate in which the FPC is used in the resin layer 61 of the variable parts 16, and a glass epoxy substrate is used in the resin layer 61 of the portions other than the variable parts 16. By configuring in such a manner, the substrate for connection 10 is bent at only the portion of the variable parts 16 which uses the FPC, so that the folding operation may be easily performed.

The connection terminal block 11 may be provided in two, four or more. The substrate for connection 10 may be provided with the variable parts 16 in the number of one less than the number of the connection terminal blocks 11. When the substrate for connection 10 is provided with a plurality of variable parts 16, only a part of the variable parts 16 may be folded or slackened.

The plurality of extension parts 17 may have dimensions different from each other. In such a case, the display panel 30 is provided with the terminal parts (not illustrated) corresponding to the arrangement of the connection terminal block 11 provided in each of the extension parts 17.

A plurality of connection parts 18 and the connectors 15 may be provided. In this case, the signal processing board 40 may be provided with the connectors 41 in the number and arrangement corresponding to the number and arrangement of the connector 15.

The first electrode terminals 12 may be arranged in a so-called staggered shape in which they are alternately arranged in two rows. The connection terminal pitch direction of the case in which the first electrode terminals 12 are arranged in the staggered shape is a direction parallel to each row of the first electrode terminals 12. By configuring in such a manner, an area of the first electrode terminals 12 may be sufficiently secured even with a high density of the wiring in the connection terminal pitch direction, and thereby a strength of the connection to the display panel 30 may be sufficiently secured.

The driver circuits 32 may be embedded in the display panel 30. In addition, it is possible to use the substrate for connection 10 even when the driver circuits 32 are provided in the signal processing board 40.

Embodiment 2

The present embodiment relates to a substrate for connection 10 which is adequately executed to mitigate the repulsive force of the folding and facilitate the folding by narrowing the width of the variable parts 16 in the direction perpendicular to the connection terminal pitch direction compared to the other portions.

Figure 10:
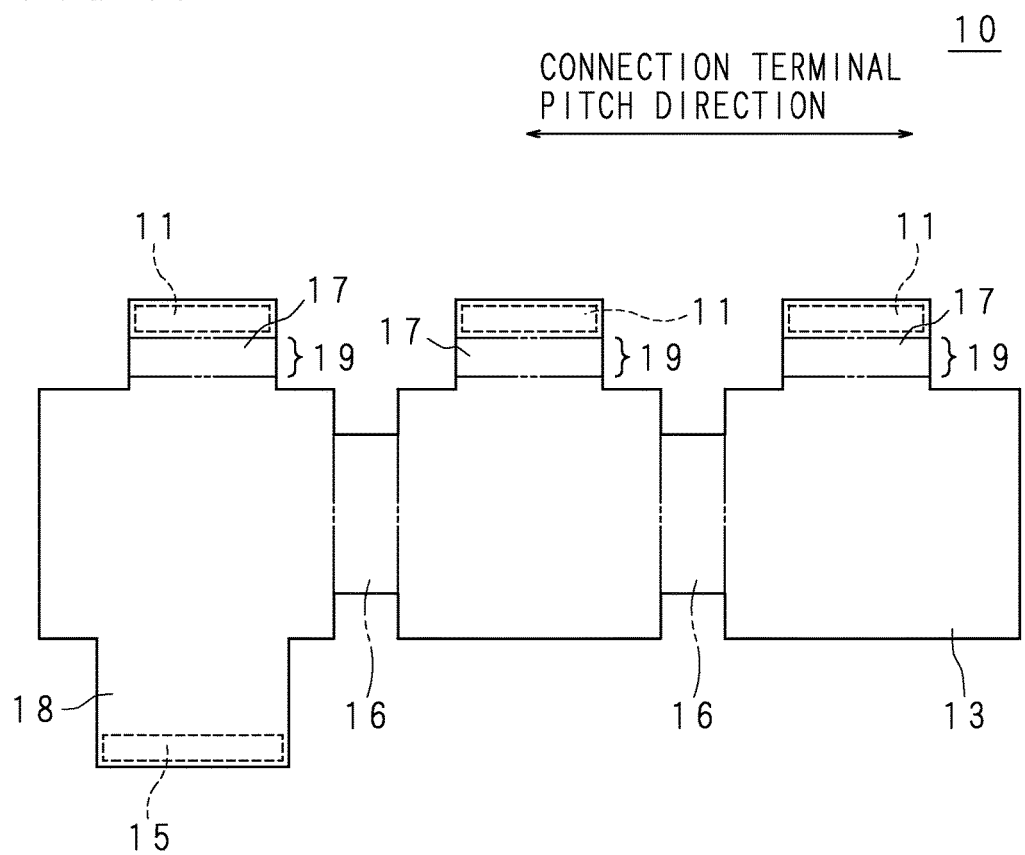
FIG. 10 is a plan view of a substrate for connection according to Embodiment 2.

FIG. 10 is a plan view of the substrate for connection 10 according to Embodiment 2. The substrate for connection 10 according to the present embodiment will be described with reference to FIG. 10. The portions common to Embodiment 1 will not be described.

In the substrate for connection 10 according to the present embodiment, the length of the variable parts 16 along the short side direction of the body part 13 is shorter than that of the short side of the body part 13. The variable parts 16 are disposed near a central portion of the body part 13 in the short side direction thereof. As a result, the body part 13 is formed in a shape in which both long sides of a rectangle are recessed in a rectangular shape at two places of the variable parts 16, respectively. When described with the connection terminal pitch direction, a width which is the length of the variable parts 16 provided in the body part 13 in the direction perpendicular to the connection terminal pitch direction thereof becomes narrower than the width which is the length of the body part 13 in the short side direction thereof.

The width of the variable parts 16 is set to at least a length capable of accommodating the wiring patterns which connect the first electrode terminals 12 and the connector 15. The widths of the plurality of variable parts 16 may be the same or may be different from each other.

According to the present embodiment, the bending length for folding of the variable parts 16 may be shortened. Since the repulsive force generated by folding the variable parts 16 may be mitigated, it is possible to provide the substrate for connection 10 which may be easily folded.

Embodiment 3

The present embodiment relates to a substrate for connection 10 which is adequately realized to mitigate the repulsive force of the folding and facilitate the folding by thinning a portion of the surface layer 60 corresponding to the variable part 16, compared to the other portions thereof.

Figure 11:
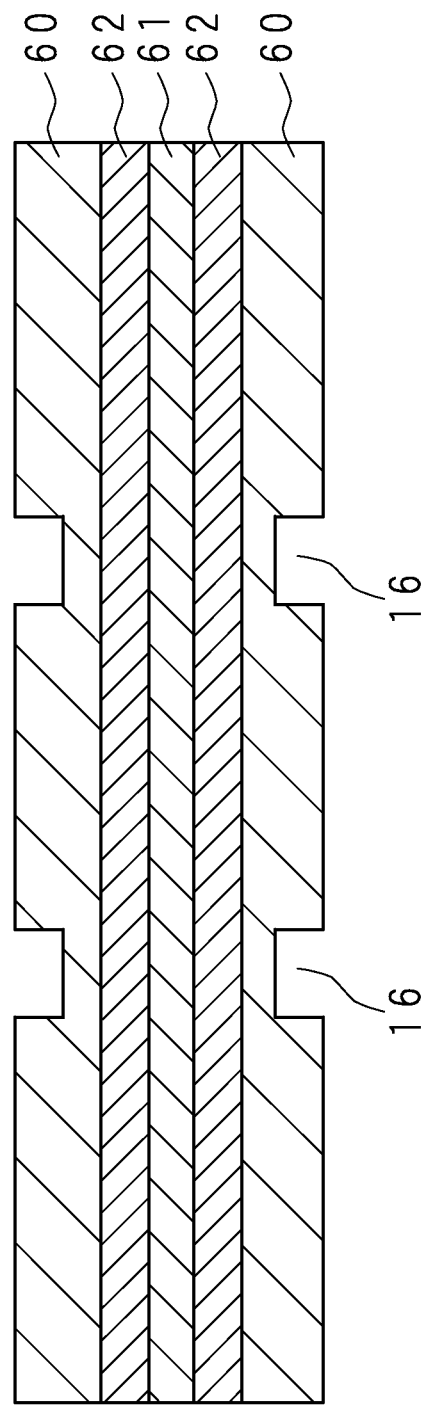
FIG. 11 is a section view of a substrate for connection according to Embodiment 3.

FIG. 11 is a section view of the substrate for connection 10 according to Embodiment 3. The substrate for connection 10 according to the present embodiment will be described with reference to FIG. 11. The portions common to Embodiment 1 will not be described.

FIG. 11 is a section view in which the body part 13 of the substrate for connection 10 is cut in the direction parallel to the long side of the body part 13. The portions of the surface layer 60 corresponding to the variable part 16 are thinned compared to the portions of the surface layer 60 other than the variable parts 16. As a result, the entirety of the substrate for connection 10 in the variable parts 16 is also thinned compared to the portions other than the variable part 16.

A method of manufacturing the variable part 16 according to the present embodiment will be described. The surface layers 60 having a uniform thickness, the resin layer 61, and the conductor layers 62 on which the wiring patterns are formed are laminated, to prepare a base material of the substrate for connection 10. Before processing the outer shape of the substrate for connection 10, so-called half etching in which a part of the surface layer 60 to be the variable part 16 is thinned using a chemical reaction is performed. Thereafter, outer shape processing and mounting of the connector 15 are performed to complete the substrate for connection 10.

According to the present embodiment, since the portions of surface layer 60 corresponding to the variable part 16 are thinned compared to the portions of the surface layer 60 other than the variable parts 16, the substrate for connection 10 is spontaneously bent at the variable parts 16 while folding the same. Therefore, the folding operation may be easily performed. As the portions of surface layer 60 corresponding to the variable parts 16 are thinner, the repulsive force during folding the variable parts 16 may be mitigated to facilitate the folding.

Thinning of the variable parts 16 may also be performed using laser processing. In addition, by attaching a reinforcing plate such as a polyimide sheet or a glass epoxy substrate to the surface layer 60 at places other than the variable parts 16, the portions of surface layer 60 corresponding to the variable part 16 may be relatively thinned.

Embodiment 4

The present embodiment relates to an example in which the above-described substrate for connection 10 is applied to two types of display panel having the same size as but different numbers of the pixels from each other.

Figure 12:
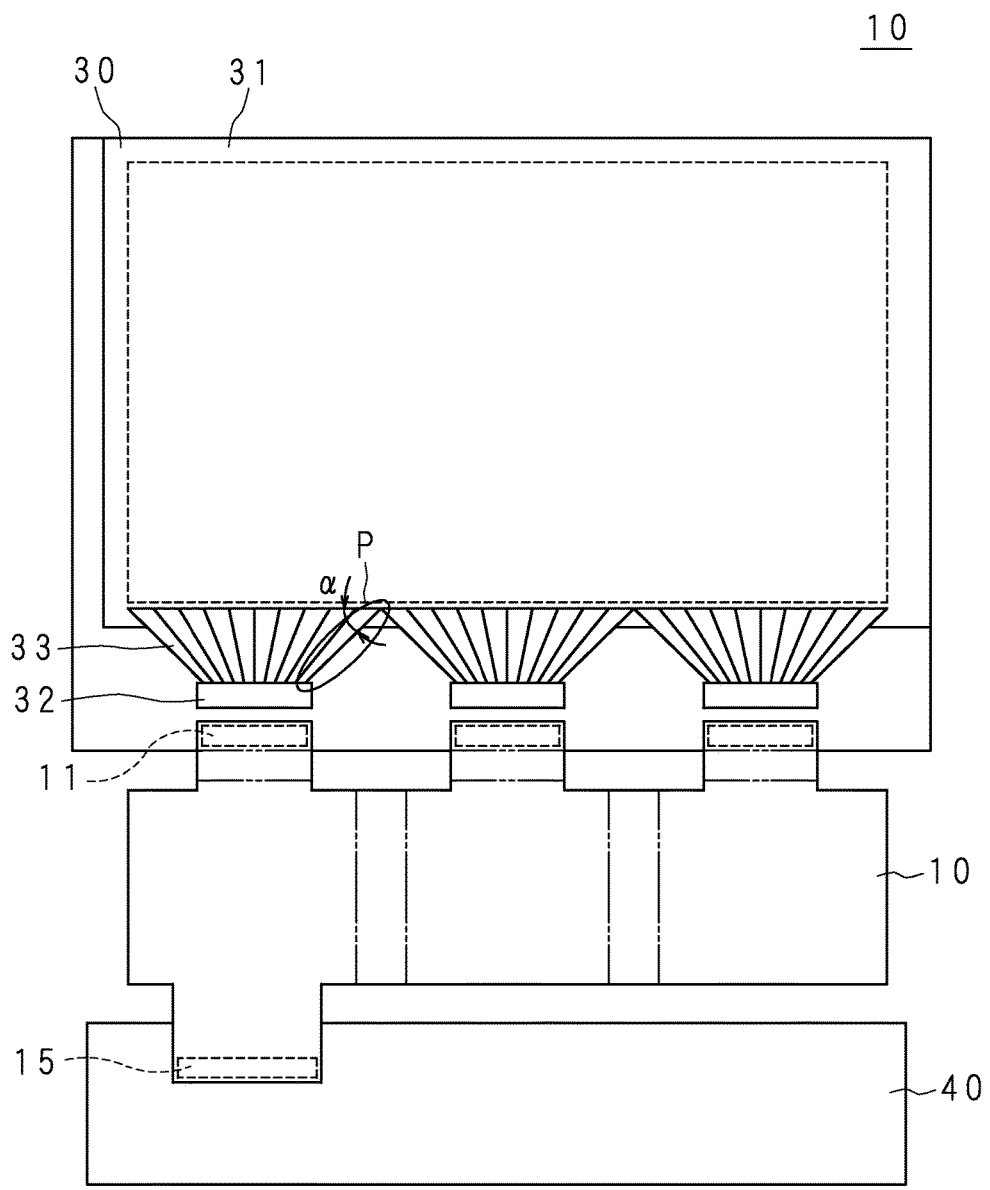
FIG. 12 is an explanatory view illustrating a usage example of a substrate for connection according to Embodiment 4.
Figure 13:
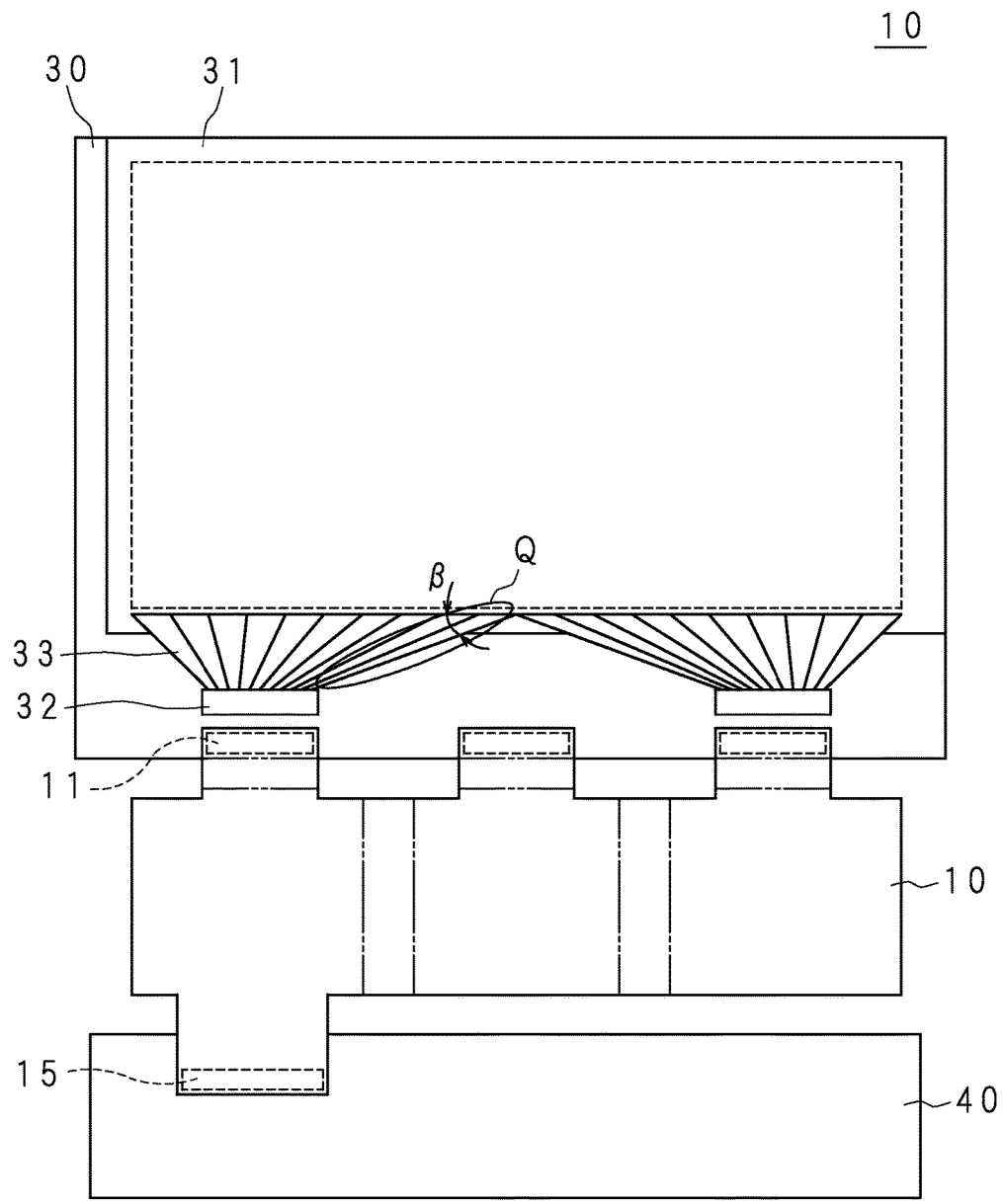
FIG. 13 is an explanatory view illustrating an improper usage example of the substrate for connection according to Embodiment 4.

FIG. 12 is an explanatory view illustrating a usage example of the substrate for connection 10 according to Embodiment 4. FIG. 13 is an explanatory view illustrating an improper usage example of the substrate for connection 10 according to Embodiment 4. The substrate for connection 10 according to Embodiment 4 will be described with reference to FIGS. 12 and 13. The portions common to those in Embodiment 1 will not be described.

In FIG. 12, the substrate for connection 10 is disposed between the display panel 30 and the signal processing board 40. The display panel 30 and the substrate for connection 10 are electrically connected through the connection member 50 made of ACF. The signal processing board 40 and the substrate for connection 10 are electrically connected through the connector 15.

The first electrode terminals 12 group is formed in the connection terminal block 11 on the display panel 30 side of the substrate for connection 10. The second electrode terminals group (not illustrated) is formed in the connection terminal to the connector 15 on the signal processing board 40. In addition, the first electrode terminals 12 and the second electrode terminals are electrically connected through a plurality of wiring patterns (not illustrated).

In addition, the driver circuits 32 are electrically connected on the display panel 30 through the ACF (not illustrated). The display pixels, the driver circuits 32 and the third electrode terminals 37 connected to the connection terminal blocks 11 of the substrate for connection 10 are electrically connected through a plurality of wiring patterns formed on the display panel 30. Herein, the wiring patterns between the driver circuits 32 and the connection terminal blocks 11 are not illustrated in the drawings. The driver circuits 32 may be embedded in the display panel 30 so long as they have the same function as that of the ICs.

In FIG. 12, the display pixels and the driver circuits 32 are connected by lead-out wirings 33. Further, the display panel 30 according to Embodiment 1 is also provided with the lead-out wirings 33 similar to the display panel 30 according to the present embodiment, but it has not been described and illustrated in Embodiment 1.

The display panel 30 illustrated in FIG. 12 is, for example, a liquid crystal display panel of a 10.4 inch and an extended graphics array (XGA) size. The XGA size means the number of pixels of 1024 horizontal pixels by 768 vertical pixels. Therefore, the display panel 30 has 3072 (=1024×3) display dots in the long side direction thereof. For example, when using three general-purpose ICs having 1200 output terminals in the driver circuits 32, 1024 lead-out wirings 33 are connected thereto per one IC.

Meanwhile, also in FIG. 13, the display pixels and the driver circuits 32 are connected by the lead-out wirings 33. When the display panel 30 is the liquid crystal display panel of a 10.4 inch and a SVGA size, the display panel 30 has 800 pixels in the long side direction thereof. Therefore, the display panel 30 has 2400 (=800×3) display dots in the long side direction thereof. For example, when using two ICs having 1200 output terminals in the driver circuits 32, 1200 lead-out wirings 33 are connected thereto per one IC.

In FIGS. 12 and 13, both of the display panels 30 are the 10.4 inch, and has the same length in the long sides thereof. When sharing the substrates for connection 10 in the both display panels 30, three ICs having 1200 output terminals are used in the display panel 30 of FIG. 12, whereas only two ICs are used in the display panel 30 of FIG. 13. Further, in FIGS. 12 and 13, all input terminals of the used driver circuits are connected to the connection terminal blocks 11 through the third electrode terminals 37 and the first electrode terminals 12.

Therefore, the substrate for connection 10 of FIG. 12 is used by connecting all the connection terminal blocks 11, whereas the substrate for connection 10 of FIG. 13 is used by connecting the connection terminal blocks 11 at both ends without connecting the center connection terminal block 11. As described above, when the distance between the ICs in the long side direction of the display panel 30 is large, that is, the number of the display pixels connected with one IC is large, in the lead-out wirings 33 illustrated in FIG. 13, the lead-out wirings 33 near the center are formed at a smaller angle with respect to a direction parallel to the long side of the display panel 30 compared to the lead-out wirings 33 of FIG. 12, which narrows a space for a wiring width of the lead-out wirings 33 and an interval between the wirings.

Figure 14:
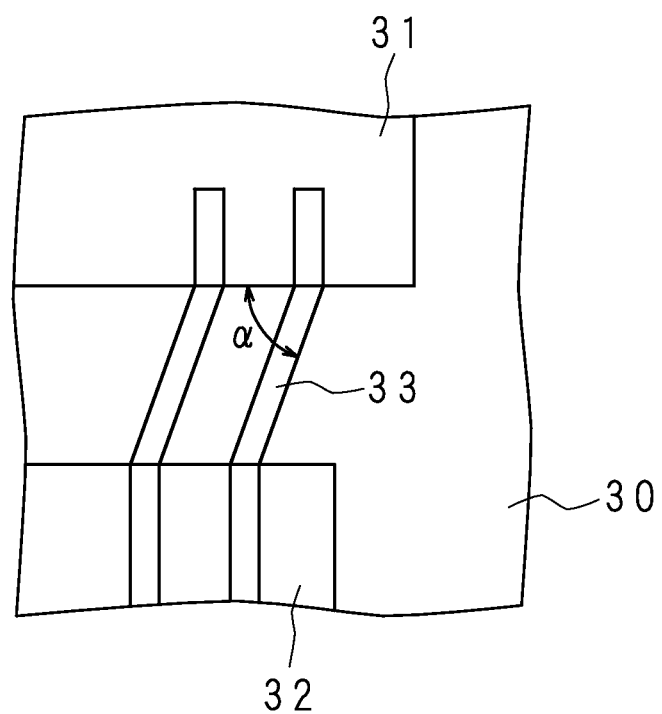
FIG. 14 is an enlarged view of a P part of lead-out wirings 33 having a shape as illustrated in FIG. 12.

FIG. 14 is an enlarged view of a P part of the lead-out wirings 33 having the shape as illustrated in FIG. 12. An angle formed by the direction parallel to the long side of the display panel 30 and the lead-out wiring 33 is set as α.

Figure 15:
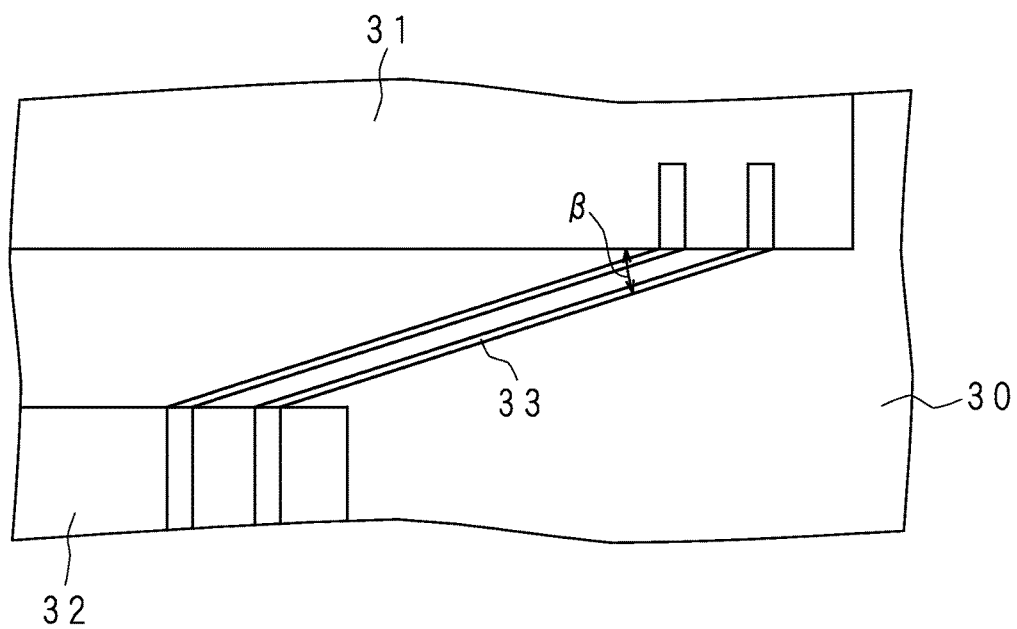
FIG. 15 is an enlarged view of a Q part of the lead-out wirings 33 having a shape as illustrated in FIG. 13.

FIG. 15 is an enlarged view of a Q part of the lead-out wirings 33 having the shape as illustrated in FIG. 13. An angle formed by the direction parallel to the long side of the display panel 30 and the lead-out wiring 33 is set as ß.

The interval and number of the wiring patterns on the driver circuits 32 side, the interval and number of the wiring patterns on the display unit 31, and the interval between the driver circuits 32 and the display unit 31 in FIGS. 14 and 15 are the same, respectively. Further, the interval of the wiring patterns on the display unit 31 side and the interval of the display dots forming the display unit 31 are the same. Furthermore, for the convenience of explanation, the difference between α and ß is exaggerated in FIGS. 14 and 15.

By the above-described reason, the angles of the lead-out wirings 33 of the display panel 30 of FIG. 12 and the display panel 30 of FIG. 13 correspond to α in FIG. 14 and ß in FIG. 15, respectively. Since ß is a smaller angle than α, the space for the wiring width of the lead-out wirings 33 and the interval between the wirings is narrowed, and thereby a desired wiring may not be provided.

Figure 16:
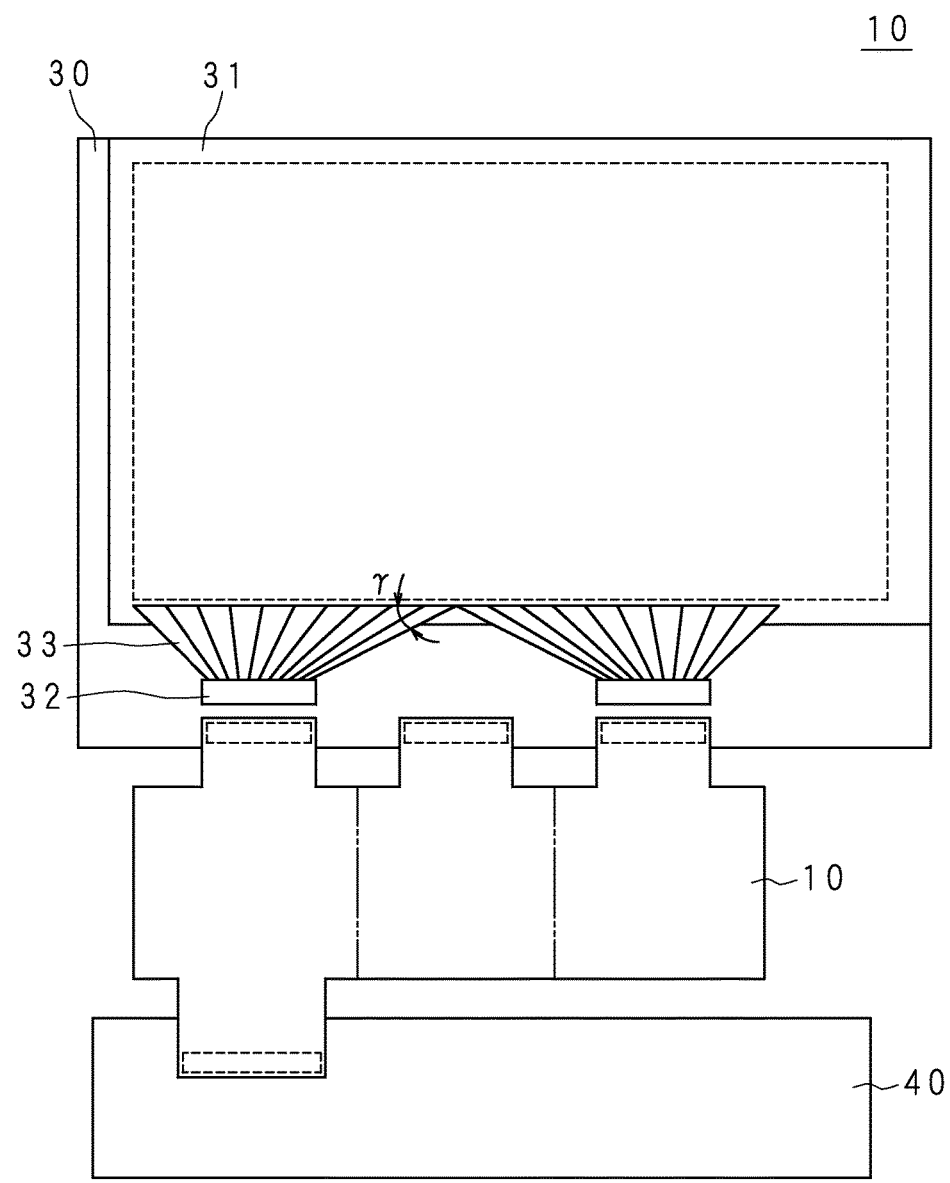
FIG. 16 is an explanatory view illustrating a proper usage example of the substrate for connection according to Embodiment 4.

FIG. 16 is an explanatory view illustrating a proper usage example of the substrate for connection 10 according to Embodiment 4. FIG. 16 is an explanatory view illustrating a case in which the same display panel 30, the substrate for connection 10 and the signal processing board 40 as those of FIG. 13 are used and the substrate for connection 10 is connected by folding.

As illustrated in FIG. 16, by folding the variable parts 16 of the substrate for connection 10 and using the first distance as the interval between the connection terminal blocks 11, the distance between two driver circuits 32 may be also narrowed. The angle at the ends of the lead-out wirings 33 becomes an angle γ which is larger than the angle ß in FIG. 15. Thus, the space in which the lead-out wirings 33 are laid is widened, and the desired wiring may be provided.

The above description will be briefly summarized. In FIG. 16, the distance between the connection terminal blocks 11 is the first distance shorter than the second distance. By folding or slackening the variable parts 16, the connection terminal blocks 11 and the first electrode terminals 12 are positioned. The first electrode terminals 12 which are not connected to the driver circuits 32 are present in the substrate for connection 10. The substrate for connection 10 is used in the above-described first form. Meanwhile, in FIG. 12, the distance between the connection terminal blocks 11 is the second distance. All the first electrode terminals 12 are connected to the driver circuits 32. In FIG. 12, the substrate for connection 10 is used in the above-described second form. The same substrates for connection 10 may be used in both forms of the first form and second form.

As described above, according to the present embodiment, in the display panel 30 having the same size but different numbers of display pixels, it is possible to share the substrate for connection 10.

Further, in the present embodiment, since the number of signal lines which output signals is different, it is difficult to completely share the signal processing board 40. However, for example, only by a minimum change of components such as a change in setting of a timing controller on the signal processing board 40, a conversion of gradation resistance or the like, it is possible to share the substrate to be a base.

As described above, according to the present embodiment, in the display panel 30 having the same size but different numbers of display pixels, it is possible to share the substrate for connection 10. In addition, it is possible to considerably reduce manufacturing costs, without resulting in waste of ICs as with the COF substrate of Patent Document 2.

In the usage example of FIG. 16, the center connection terminal block 11 which is not used may be disconnected from the substrate for connection 10. Since the substrate for connection 10 is the FPC, the connection terminal block 11 may be simply disconnected therefrom by using scissors. By configuring in such a manner, it is possible to prevent the first electrode terminals 12 which are not used from touching the display panel 30 or the like to cause a short circuit and noise.

Embodiment 5

Figure 17A:
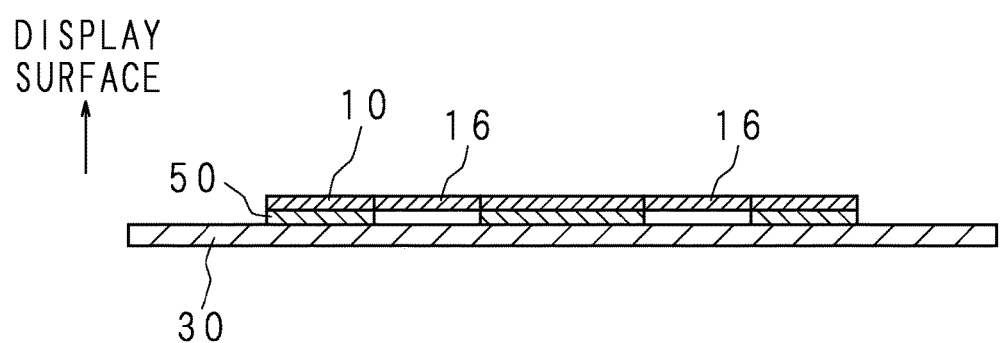
FIG. 17A and FIG. 17B illustrate section views of a display panel and a substrate for connection according to Embodiment 5.
Figure 17B:
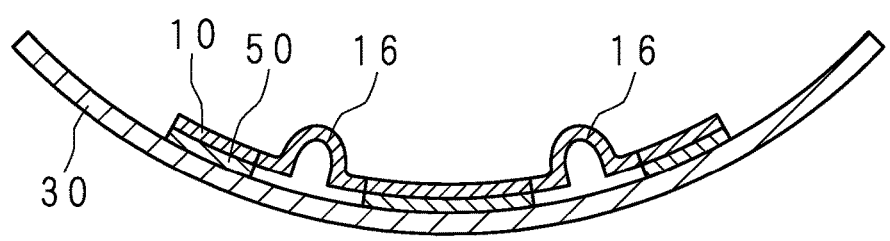

The present embodiment relates to a display apparatus 20 using the above-described substrate for connection 10 in combination with the display panel 30 in which the display surface is curved so as to be concave. FIG. 17A and FIG. 17B illustrate section views of the display panel 30 and the substrate for connection 10 according to Embodiment 5.

Generally, the display panel 30 for a curved display apparatus is often curved after connecting the substrate for connection 10. As illustrated in FIG. 17B, when curving the display panel 30 in a concave shape, the substrate for connection 10 is extended or contracted in a shrinking direction. In the case of the substrate for connection 10 having a length in accordance with a flat display apparatus, it is considered that the connection portion is peeled off due to stress by the expansion or contraction. Meanwhile, by using the substrate for connection 10 according to the present embodiment, when the FPC is shrunk by curving it in a concave shape, the variable parts 16 may be slackened to absorb the expansion or contraction.

The substrate for connection 10 according to the present embodiment will be described with reference to FIG. 17A and FIG. 17B. Further, the portions common to Embodiment 1 will not be described.

FIG. 17A is a section view in which a state of connecting the display panel 30 and the substrate for connection 10 is cut by a surface passing through the connection member 50 and being in parallel to the long side of the display panel 30. In FIG. 17A, the upside is the display surface. When connecting the display panel 30 and the substrate for connection 10, the display panel 30 is made to be flat. The display panel 30 and the substrate for connection 10 are connected by the connection members 50. The connection members 50 are not provided in the portion of the variable parts 16.

FIG. 17B is a section view illustrating a state in which the display panel 30 of FIG. 17A is curved so that the display surface becomes concave in the same cross-section as FIG. 17A. By slackening the substrate for connection 10 at the variable parts 16, a difference in the expansion or contraction between the display panel 30 and the substrate for connection 10 is absorbed. Since the stress applied to the connection members 50 may be reduced, it is difficult to cause disconnection due to the peeling-off of the connection members 50 or the like. Therefore, the display apparatus 20 employing the structure illustrated in FIG. 17A and FIG. 17B unlikely causes a failure due to disconnection.

According to the present embodiment, also in the concave curved display apparatus, it is possible to share the substrate for connection 10.

By shortening the length of the connection members 50 at one place in the long side direction of the display unit 31, and increasing the number of the connection members 50, the variable parts 16 may be provided at three places or more. By configuring in such a manner, it is possible to reduce the stress applied to the connection members 50 when forming the display panel 30 in a concave surface, and thereby further increase durability.

Embodiment 6

Figure 18A:
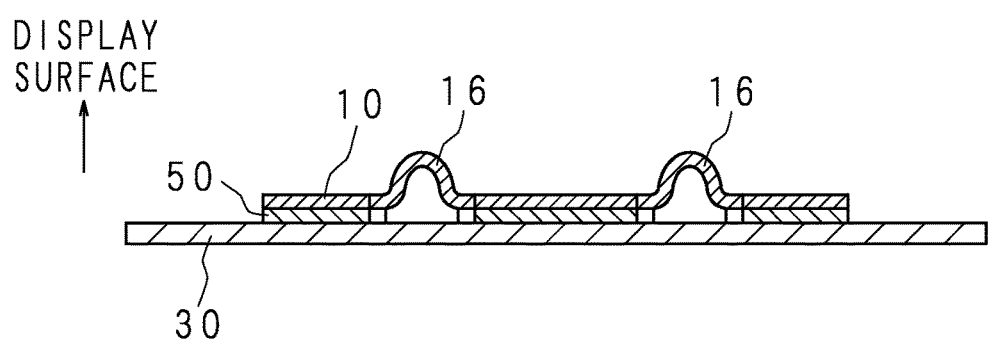
FIG. 18A and FIG. 18B illustrate section views of a display panel and a substrate for connection according to Embodiment 6.
Figure 18B:
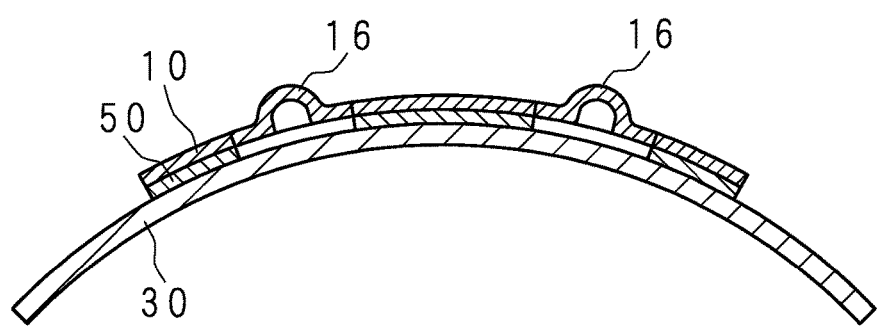

The present embodiment relates to a display apparatus 20 using the above-described substrate for connection 10 in combination with the display panel 30 in which the display surface is curved so as to be convex. FIG. 18A and FIG. 18B illustrate section views of the display panel 30 and the substrate for connection 10 according to Embodiment 6.

Generally, the display panel 30 for a curved display apparatus is often curved after connecting the substrate for connection 10 thereto. As illustrated in FIG. 18B, when curving it in a convex shape, the substrate for connection 10 is extended or contracted in a stretching direction thereof. In the case of the substrate for connection 10 having a length in accordance with the flat display apparatus, the connection portion may be peeled off due to the stress by the expansion or contraction. On the other hand, by connection in a state in which variable parts 16 are previously folded by using the FPC of the present invention, the variable parts 16 may be extended to absorb the expansion or contraction when the FPC is extended by curving it in a convex shape.

The substrate for connection 10 according to the present embodiment will be described with reference to FIG. 18A and FIG. 18B. Further, the portions common to Embodiment 1 will not be described.

FIG. 18A is a section view in which a state of connecting the display panel 30 and the substrate for connection 10 is cut by a surface passing through the connection members 50 and being in parallel to the long side of the display panel 30. In FIG. 18A, the upside is the display surface. When connecting the display panel 30 and the substrate for connection 10, the display panel 30 is made to be flat, and the substrate for connection 10 is slackened at the variable parts 16. The display panel 30 and the substrate for connection 10 are connected by the connection members 50. The connection members 50 are not provided in the portion of the variable parts 16.

FIG. 18B is a section view illustrating a state in which the display panel 30 of FIG. 18A is curved so that the display surface becomes convex in the same cross-section as FIG.

18A. Slackening of the variable parts 16 is reduced, such that a difference in the expansion or contraction between the display panel 30 and the substrate for connection 10 is absorbed. Since the stress applied to the connection members 50 may be reduced, it is difficult to cause the disconnection due to the peeling-off of the connection members 50 or the like. Therefore, the display apparatus 20 employing the structure illustrated in FIG. 18A and FIG. 18B unlikely causes a failure due to disconnection, thereby having high durability.

According to the present embodiment, also in the convex curved display apparatus, it is possible to share the substrate for connection 10.

By shortening the connection members 50 at one place, and increasing the number of the connection members 50, the variable parts 16 may be provided at three places or more. By configuring in such a manner, it is possible to reduce the stress applied to the connection members 50 when forming the display panel 30 in a convex surface, and thereby to further increase durability.

It is possible to achieve a corrugated display apparatus 20 by combining the structure according to Embodiment 5 with the structure according to Embodiment 6.

In addition, technical characteristics (configuration requirements) described in each embodiment may be combined with each other, and new technical characteristics may be formed by combining the same.

It should be understood that the embodiments disclosed herein are illustrative and non-restrictive in every respect. Since the scope of the present invention is defined by the appended claims rather than by the description preceding them, and all changes that fall within metes and bounds of the claims, or equivalence of such metes and bounds thereof are therefore intended to be embraced by the claims.

What is claimed is:

1. A substrate for connection electrically connecting a display panel and a signal processing board which includes a circuit to control the display panel, wherein the display panel is provided with a plurality of the driver circuits to drive the display panel, the plurality of the driver circuits are disposed separately in the display panel, the substrate for connection is integrally formed, the substrate for connection comprises variable parts configured to change a distance between connection blocks in a connection terminal pitch direction, between the connection blocks, connection terminals in the connection blocks, the connection blocks positioned by the variable parts are connected to the plurality of driver circuits which are separately disposed, the substrate for connection does not have an active device disposed thereon, and the connection blocks and the plurality of driver circuits are connected in any one of a first form having the connection blocks which are not connected to the plurality of driver circuit between the connection blocks connected to the plurality of driver circuits in a first distance state in which the distance between the connection blocks is shortened by the variable parts, and a second form in which all the connection blocks are connected to the plurality of the driver circuits in a second distance state in which the distance between the connection blocks is elongated more than the first distance by the variable parts.

2. The substrate for connection according to claim 1, wherein the distance between the connection blocks is configured to be changed by folding or slackening a portion between the connection blocks.

3. The substrate for connection according to claim 2, wherein the connection blocks extend in a direction perpendicular to a folding direction or a slackening direction of the substrate for connection from an upper side portion of the substrate for connection, and further the substrate for connection is extended in a width direction of the connection blocks by a required amount.

4. The substrate for connection according to claim 2, wherein a surface layer at the portion of folding or slackening is thinned.

5. The substrate for connection according to claim 2, wherein a width of the substrate for connection at the folding portion or the slackening portion in a direction perpendicular to the connection terminal pitch direction is narrowed.

6. The substrate for connection according to claim 5, wherein a connection block not connected to the plurality of driver circuits is provided between two of the connection blocks connected to the plurality of driver circuits.

7. A display apparatus comprising:
the display panel according to claim 1;
the signal processing board which includes the circuit to control the display panel according to claim 1; and
the substrate for connection according to claim 1, which is disposed between the display panel and the signal processing board,
wherein a first electrode group on a display panel side and a second electrode group on a substrate for connection side are connected by a conductive member, and
a third electrode group on a signal processing board side and a fourth electrode group on the substrate for connection side are connected by a conductive member or a connector.

8. The display apparatus according to claim 7, wherein the plurality of driver circuits which drive the display panel are mounted or embedded in the display panel.

9. The display apparatus according to claim 7, wherein the substrate for connection is folded back at a portion in which the connection blocks are extended.

* * * * *